US008063554B2

(12) United States Patent
Holmes et al.

(10) Patent No.: US 8,063,554 B2
(45) Date of Patent: Nov. 22, 2011

(54) PHOSPHORESCENT OLED

(75) Inventors: Andrew Bruce Holmes, Parkville (AU); Carl Towns, Essex (GB); Stephen O'Connor, Suffolk (GB)

(73) Assignees: CDT Oxford Limited, Cambridgeshire (GB); Cambridge Display Technology Limited, Cambridgeshire (GB)

( * ) Notice: Subject to any disclaimer, the term of this patent is extended or adjusted under 35 U.S.C. 154(b) by 1201 days.

(21) Appl. No.: 11/721,321

(22) PCT Filed: Dec. 12, 2005

(86) PCT No.: PCT/GB2005/004768
§ 371 (c)(1),
(2), (4) Date: Jun. 8, 2007

(87) PCT Pub. No.: WO2006/064194
PCT Pub. Date: Jun. 22, 2006

(65) Prior Publication Data
US 2009/0236972 A1 Sep. 24, 2009

(30) Foreign Application Priority Data

Dec. 13, 2004 (GB) .................................. 0427266.2

(51) Int. Cl.
H01L 51/54 (2006.01)
H01L 51/56 (2006.01)
(52) U.S. Cl. .......... 313/504; 428/690; 428/917; 257/40; 257/E51.044; 427/66
(58) Field of Classification Search ........................ None
See application file for complete search history.

(56) References Cited

U.S. PATENT DOCUMENTS

| 5,723,873 | A | 3/1998 | Yang |
| 5,777,070 | A | 7/1998 | Inbasekaran et al. |
| 5,798,170 | A | 8/1998 | Zhang et al. |
| 6,117,567 | A * | 9/2000 | Andersson et al. ........... 428/690 |
| 6,268,695 | B1 | 7/2001 | Affinito |
| 2002/0028329 | A1 * | 3/2002 | Ise et al. ........................ 428/336 |
| 2002/0086180 | A1 * | 7/2002 | Seo et al. ...................... 428/690 |
| 2002/0117662 | A1 | 8/2002 | Nii |
| 2002/0182441 | A1 | 12/2002 | Lamansky et al. |
| 2003/0015960 | A1 * | 1/2003 | Seo et al. ...................... 313/504 |
| 2004/0155238 | A1 * | 8/2004 | Thompson et al. ............. 257/40 |
| 2004/0260047 | A1 * | 12/2004 | Chen et al. ........................ 528/4 |

FOREIGN PATENT DOCUMENTS

| EP | 0 707 020 | 4/1996 |
| EP | 0 842 208 | 5/1998 |
| EP | 0 880 303 | 11/1998 |
| EP | 0 901 176 | 3/1999 |
| EP | 0 947 123 | 10/1999 |
| EP | 1 245 659 | 10/2002 |
| EP | 1 424 350 | 6/2004 |
| GB | 2 348 316 | 9/2000 |
| JP | 2002-100474 | 4/2002 |
| WO | WO-98/10621 | 3/1998 |
| WO | WO-98/57381 | 12/1998 |
| WO | WO-00/48258 | 8/2000 |
| WO | WO-00/53656 | 9/2000 |
| WO | WO-01/19142 | 3/2001 |
| WO | WO-01/81649 | 11/2001 |
| WO | WO-02/26856 | 4/2002 |
| WO | WO-02/44189 | 6/2002 |
| WO | WO-02/45466 | 6/2002 |
| WO | WO-02/066552 | 8/2002 |
| WO | WO-02/068435 | 9/2002 |
| WO | WO-02/081448 | 10/2002 |
| WO | WO-02/084759 | 10/2002 |
| WO | WO-03/007395 | 1/2003 |
| WO | WO-03/091355 | 11/2003 |

OTHER PUBLICATIONS

Baldo et al., "Excitonic Singlet-Triplet Ratio in a Semiconductor Organic Thin Film," *Phys. Rev. B*, 60:14422-14428 (1999).
Cao et al., "Improved Quantum Efficiency for Electroluminescence in Semiconducting Polymers," *Nature*, 397:414-417 (1999).
Chen et al., "High-Efficiency Red-Light Emission from Polyfluorenes Grafted with Cyclometalated Iridium Complexes and Charge Transport Moiety," *J. Am. Chem. Soc.*, 125:636-637 (2003).
Hino et al., "Efficient Low-Molecule Phosphorescent Organic Light-Emitting Diodes Fabricated by Wet-Processing," *Organic Electronics*, 2:265-270 (2004).
Kohler et al., "Fluorescence and Phosphorescence in Organic Materials," *Adv. Mater.*, 14(10):701-707 (2002).
Lane et al., "Origin of Electrophosphorescence from a Doped Polymer Light Emitting Diode," *Phys. Rev. B*, 63:235206-1-235206-8, (2001).
McGehee et al., "Narrow Bandwidth Luminescence from Blends with Energy Transfer from Semiconducting Conjugated Polymers to Europium Complexes," *Adv. Mater.*, 11:1349-1354 (1999).
Meulenkamp et al., "High Efficiency Polymer LEDs: Triplets and Novel Devices," *Proceedings of the SPIE*, 5464:90-103 (2004).
Monkman et al., "Triplet Energies of Conjugated Polymers," *Phys. Rev. Lett.*, 86(7):1358-1361 (2001).
Niu et al., "Thermal Annealing Below the Glass Transition Temperature: A General Way to Increase Performance of Light-Emitting Diodes Based on Copolyfluorenes," *Appl. Phys. Lett.*, 81(4):634-636 (2002).

(Continued)

Primary Examiner — Marie R. Yamnitzky
(74) Attorney, Agent, or Firm — Marshall, Gerstein & Borun LLP

(57) ABSTRACT

An organic light emitting device having a phase-separated light-emissive layer comprising:
a charge transport phase comprising a charge transport material; and
an emitting phase, the emitting phase comprising a plurality of discrete emissive domains dispersed in the charge transport phase, each emitting domain comprising a host material and one or more metal complexes for emitting light by phosphorescence;
wherein the charge transport material has a T1 energy level lower than the T1 energy level of the metal complexes and the host material has a T1 energy level higher than the T1 energy level of the metal complexes.

13 Claims, 3 Drawing Sheets

OTHER PUBLICATIONS

Setayesh et al., "Bridging the Gap Between Polyfluorene and Ladder-Poly-*p*-Phenylene: Synthesis and Characterization of Poly-2,8-Indenofluorene," *Macromolecules*, 33:2016-2020 (2000).

van Dijken et al., "Carbazole Compounds as Host Materials for Triplet Emitters in Organic Light-Emitting Diodes: Polymer Hosts for High-Efficiency Light-Emitting Diodes," *J. Am. Chem. Soc.*, 126:7718-7727 (2004).

Wilson et al., "Spin-Dependent Exciton Formation in $\pi$-Conjugated Compounds," *Nature*, 413:828-831 (2001).

Yamaguchi et al., "Effects of B and C on the Ordering of $L1_0$-CoPt Thin Films," *Appl. Phys. Lett.*, 79(13): 2001-2003 (2001).

Yang et al., "Efficient Blue Polymer Light-Emitting Diodes from a Series of Soluble Poly(paraphenylene)s," *J. Appl. Phys.*, 79:934-939 (1996).

Combined Search and Examination Report for Application No. GB0427266.2, dated May 11, 2005.

International Preliminary Report on Patentability for International Application No. PCT/GB2005/004768, dated Jun. 13, 2007.

International Search Report for International Application No. PCT/GB2005/004768, dated Apr. 3, 2006.

Written Opinion for International Application No. PCT/GB2005/004768, dated Apr. 3, 2006.

* cited by examiner

PHOSPHORESCENT OLED

BACKGROUND OF THE INVENTION

1. Field of the Invention

The invention relates to a novel organic light emitting device (OLED), to novel materials that are capable of phosphorescence, and to methods of making the device and novel materials.

2. Related Technology

Luminescent conjugated polymers are a new technologically important class of materials that will be used in light emitting display devices for the next generation of information technology based consumer products. The principle interest in the use of polymers, as opposed to inorganic semiconducting and organic dye materials, lies in the scope for low-cost manufacturing, using solution-processing of film-forming materials. Since the last decade much effort has been devoted to the improvement of the emission efficiency of OLEDs either by developing highly efficient materials or efficient device structures.

In OLEDs, electrons and holes are injected from opposite electrodes and are combined to form two types of excitons; spin-symmetric triplets and spin-antisymmetric singlets in a theoretical ratio of 3:1. Radiative decay from the singlets is fast (fluorescence), but from the triplets (phosphorescence) it is formally forbidden by the requirement of the spin conservation.

Initially spurred on by this understanding that the maximum internal quantum efficiency of an OLED was limited to 25% the idea of transferring both singlets and triplets to a phosphorescent dopant was conceived. Such a dopant ideally is able to accept both singlet and triplet excitons from the organic material and generate luminescence, particularly electroluminescence from both.

This idea is still highly applicable even given recent studies questioning the 3:1 triplet to singlet ratio predicted by the spin-independent recombination model. Recent studies suggest that the proportion of triplet excitons generated in small molecule devices is indeed close to 75%, (Baldo, M. A.; O'Brien, D. F.; Thompson, M. E.; Forrest, S. R. Phys. Rev. B 1999, 60, 14422) whereas in some electrically excited conjugated polymers it is suggested to be around 50%, (Cao, Y.; Parker, I. D.; Yu, G.; Zhang, C.; Heeger, A. J. Nature 1999, 397, 414 and Wilson, J. S.; Dhoot, A. S.; Seeley, A. J. A. B.; Khan, M. S.; Köhler, A.; Friend, R. H. Nature 2001, 413, 828). Evidence for the copious generation of triplet excitons in polymer LEDs has been obtained by magnetic and optical observations.

Many have studied the incorporation by blending of phosphorescent materials into a semiconductive layer. Blends incorporate a phosphorescent dopant and a small molecule or a non-conjugated polymer host. The host material is required to transport charge to the dopant. Typical examples of good charge transport materials are polymers with extended conjugation lengths. Conjugated polymers have also been disclosed as hosts, for example a blend of Eu(dnm)3phen in CN-PPP with a quantum efficiency of 1.1%. [Adv. Mater., 1999, 11, 1349.]. Similarly, Phys. Rev. B 2001, 63, 235206 discloses poly(9,9-dioctylfluorene) doped with 2,3,7,8,12, 13,17,18-octaethyl-21H,23H-porphyrin platinum (II). Reference also may be made to WO 03/091355, which discloses a material capable of luminescence comprising a polymer or oligomer; and an organometallic characterized in that the organometallic is covalently bound to the polymer or oligomer and the nature, location and/or proportion of the polymer or oligomer and of the organometallic in the material are selected so that the luminescence predominantly is phosphorescence. It is said that this material generally is superior to a polymer blend incorporating a phosphorescent dopant. This is because problems relating to morphology changes such as aggregation and phase separation are avoided. It is further said that the controlled structure of the material means that the location and mobility of the organometallic in the material is spatially controlled. This spatial control enables control of the interaction between the polymer or oligomer and the organometallic.

However, there are problems with using conjugated polymers as host materials. The host material must have a sufficiently high T1 energy level (the energy level of the lowest triplet excited state) to avoid quenching of the dopant. Put simply, quenching can occur when the T1 level of the host material is lower than the T1 of the dopant so that non-radiative transfer of the triplet exciton from the dopant to the host material is more favourable than radiative decay. This presents a particular problem for blue dopants and green dopants, which have larger band gaps than red dopants, which means higher T1 levels. This is a problem because a typical good host material with good charge transport properties will typically have relatively low T1 level due to extended regions of conjugation, as discussed above. Thus, for blue and green dopants it is especially difficult to find host materials with sufficiently high T1 levels. To date, polyvinylcarbazole has been disclosed as a host material with a sufficiently high T1 level to render it suitable for use with green dopants. However, polyvinylcarbazole has inferior charge transport properties as compared with conjugated polymers, which leads to poor lifetimes when used in a device. Carbazole compounds as hosts for triplet emitters are the subject of J. Am. Chem. Soc. 2004, 126, 7718 to 7727.

Therefore, it will be understood that there exists a need to provide a host material for higher triplet energy materials such as green dopants, which has a sufficiently high T1 level combined with good charge transport properties.

In this regard, a material with good charge transport properties can be characterized by:
a T1 level lower than the T1 level of the dopant;
a LUMO level close to the workfunction of the cathode;
a HOMO level close to the workfunction of the anode;
high inter- and intra-chain order;
some degree of conjugation.

GENERAL DESCRIPTION OF THE INVENTION

The invention at least partially addresses this need by providing a new host material for dopants, in particular dopants that emit by phosphorescence at wavelengths less than or equal to 580 nm, for use in an OLED and a method for making the same.

The invention also provides a new OLED containing the new material and a method for making the same.

Thus, a first aspect of the invention provides an organic light emitting device having a phase-separated light-emissive layer comprising:
wherein the charge transport material has a T1 energy level lower than the T1 energy level of the metal complexes and the host material has a T1 energy level higher than the T1 energy level of the metal complexes.

The skilled person will know suitable techniques for measuring the T1 energy levels of the charge transport material, the host material and the metal complexes. For example, "Fluorescence and Phosphorescence in Organic Materials" Anna Kohler, Joanne S. Wilson and Richard Friend, Adv. Mater. 2002, 14 No. 10, May 17 refers to the following methods and techniques for determining the energy of the non-emissive triplet states in host materials: time-resolved detection, optically detected magnetic resonance, electron paramagnetic resonance, pulsed radiolysis, and energy transfer measurements. "Triplet Energies of conjugated polymers, Phys. Rev. Lett. Vol 86, No. 7 12 Feb. 2001 A. P Monkman et al refers to the use of pulse radiolysis and triplet energy transfer to measure triplet energies in a broad range of different conjugated polymers.

The phase separated morphology of the light-emissive layer allows efficient triplet emission to occur from a domain "rich" in high triplet energy material, while maintaining efficient charge transport within a phase "rich" in low triplet energy material. The phase-separated structure of the light-emissive layer enables high efficiency phosphorescent emission with little or no quenching of the triplet states by the low triplet energy charge transport material. Phase separation can be observed by AFM microscopy.

The device according to the first aspect presents particular advantages when the metal complexes have relatively high triplet energy, in particular green emitters i.e. a phosphorescent material wherein the metal complexes are capable of emitting green light having a wavelength in the range of from 510 to 580 nm, preferably 510 to 570 nm. This is because, as explained above, known host materials suitable for use with green dopants do not have good charge transport properties. The inventive device represents a significant advantage over prior art devices because it combines the desirable properties of charge transport polymers, with high efficiency triplet emission from the metal complexes, without the associated quenching.

The LED will have an anode, a cathode and a light emissive layer located between the anode and the cathode. The anode may be, for example, a layer of transparent indium tin oxide. The cathode may be, for example, LiAl. Holes and electrons that are injected into the device recombine radiatively in the light emissive layer. A hole transport layer optionally is located between the anode and the light emissive layer. Optionally, a hole injection layer, such as a layer of doped polyethylene dioxythiophene (PEDOT), in particular PEDOT doped with polystyrene sulfonic acid (PSS), may be present between the hole transport layer and the anode. This provides an energy level which helps the holes injected from the anode to reach the hole transport layer and the light emissive layer.

The LED also may have an electron transport layer situated between the cathode and a light emissive layer. This provides an energy level which helps the electrons injected from the cathode to reach the light emissive layer.

The light emissive layer can itself comprise a laminate, effectively made up of sub-layers.

The LED may have further layers in addition to those mentioned above. For example, the LED may have one or more charge or exciton blocking layers.

The charge transport material, the host material, and the metal complexes generally are solution processable since solution processing enables the phase separation. To this end, it is preferred that they are soluble in a common organic solvent such as benzene and mono- or poly-alkylated benzene, in particular xylene and toluene. Typically, a solution processable charge transport material comprises solubilizing substituent groups such as C1-C20 alkyl and alkoxy groups.

Typically, the charge transport phase is a continuous phase. The charge transport phase may consist of the charge transport material.

Referring to the charge transport phase, this phase can transport holes and/or electrons. The precise charge transport requirements for the charge transport phase will depend on the other components of the light emitting device and, in particular the relative energy levels of those components. Preferably the charge transport phase comprises a charge transport polymer. However, the invention is not so limited and any suitable charge transport material (such as a small molecule or dendrimer) may be used provided that it is capable of forming a charge transport phase.

Preferably the charge transport polymer is conjugated; containing partial, full or cross-conjugation. More preferably, the charge transport polymer is conjugated along all or substantially all of the polymer backbone. Generally, an increase in the extent of conjugation in a material can be said to lower the triplet energy level of that material. As such, controlling the extent of conjugation can be a useful method of controlling at least partially the triplet energy level. Conjugated charge transport polymers are well-known in this art and the skilled person will know suitable repeat units to be present in the polymer.

In order to increase conjugation of the charge transport polymer, it is preferred that the polymer comprises one or more optionally substituted aryl or heteroaryl repeat units.

Examples of substituents include:

solubilizing groups such as a branched, linear or cyclic C1-C20 alkyl group; a branched, linear or cyclic C1-C20 alkoxy group; a perfluoroalkyl group; a thioalkyl group; an aryl group; an alkylaryl group; an alkoxyaryl group; a heteroaryl group, or a heteroarylalkyl group. Optionally substituted C4-C20 alkyl groups and aryl groups are preferred. C1 to C10 alkyl groups are most preferred;

electron withdrawing groups such as fluorine, nitro or cyano; and substituents for increasing glass transition temperature (Tg) of the polymer.

Preferred aryl or heteroaryl repeat units comprise a group selected from the group consisting of carbazole; 2,7-linked 9,9 disubstituted fluorene; spirofluorene; indenofluorene; p-linked dialkyl phenylene; p-linked disubstituted phenylene; phenylene vinylene; 2,5-linked benzothiadiazole; 2,5-linked substituted benzothiadiazole; 2,5-linked disubstituted benzothiadiazole; 2,5-linked substituted or unsubstituted thiophene; or a triarylamine. In one embodiment, the present material preferably comprises a polyfluorene or polyphenylene, most preferably a polyfluorene homopolymer/oligomer or higher order polymer/oligomer such as a copolymer/oligomer.

A preferred aryl repeat unit comprises a substituted or unsubstituted 2,7-linked fluorene group, for example a repeat unit comprising general formula I:

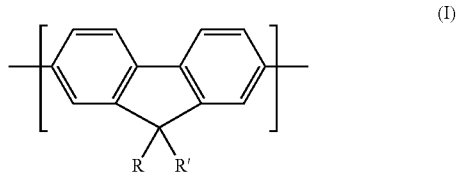

(I)

which may be further substituted and where R and R' may be the same or different and R and R' each represents H or a substituent group. Optionally R and R' are linked, for example where R=R'=phenyl. Preferably one or both of R and R' comprises a solubilizing group or an electron withdrawing group as discussed above.

Preferred charge transport polymers comprise a first repeat unit selected from arylene repeat units, in particular: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted.

A homopolymer of the first repeat unit, such as a homopolymer of 9,9-dialkylfluorene-2,7-diyl, may be utilised to provide electron transport.

A copolymer comprising a carbazole repeat unit and a first repeat unit may be utilised to provide hole transport.

A copolymer comprising a first repeat unit and a triarylamine repeat unit, in particular a repeat unit selected from formulae 1-6, may be utilised to provide hole transport.

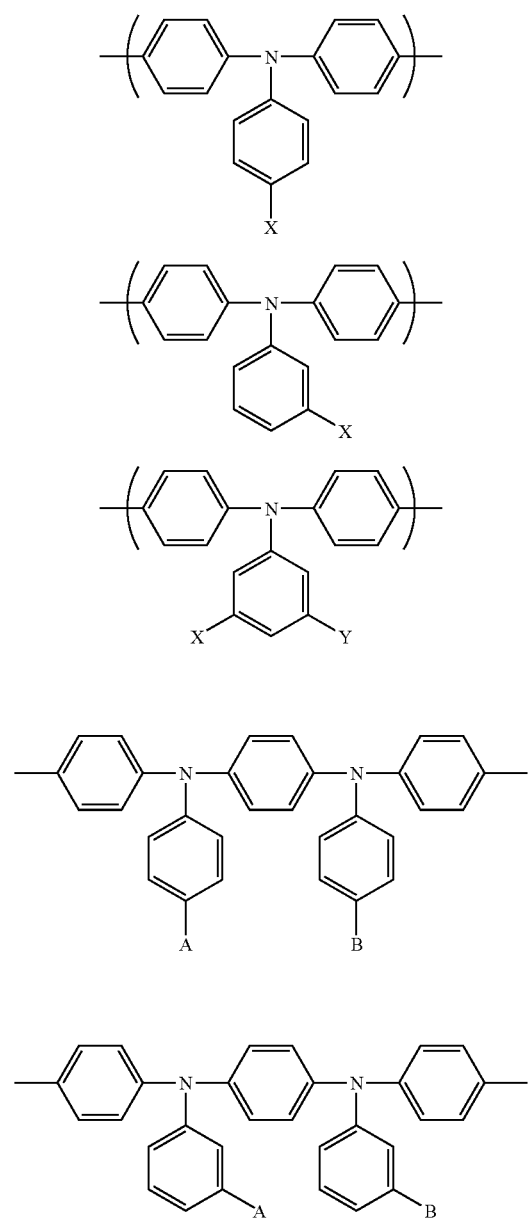

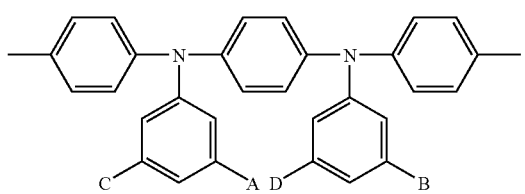

wherein X, Y, A, B, C and D are independently selected from H or a substituent group. More preferably, one or more of X, Y, A, B, C and D is independently selected from the group consisting of solubilizing groups and electron withdrawing groups as discussed above.

Particularly preferred hole transporting polymers of this type are AB copolymers of the first repeat unit and one of the aforementioned triarylamine or carbazole repeat units.

A copolymer comprising a first repeat unit and heteroarylene repeat unit may be utilised for charge transport. Preferred heteroarylene repeat units are selected from formulae 7-21:

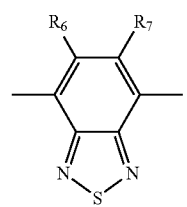

wherein R6 and R7 are the same or different and are each independently hydrogen or a substituent group. Preferred substituent groups are solubilizing groups and electron withdrawing groups as discussed above. For ease of manufacture, R6 and R7 are preferably the same. More preferably, they are the same and are each a phenyl group.

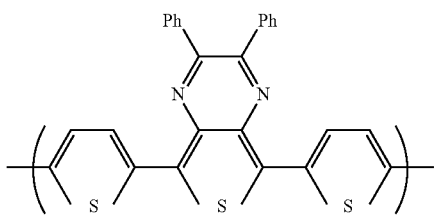

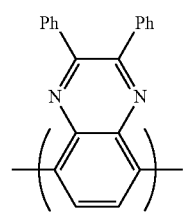

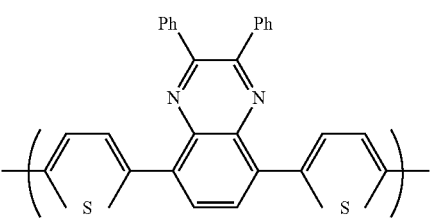

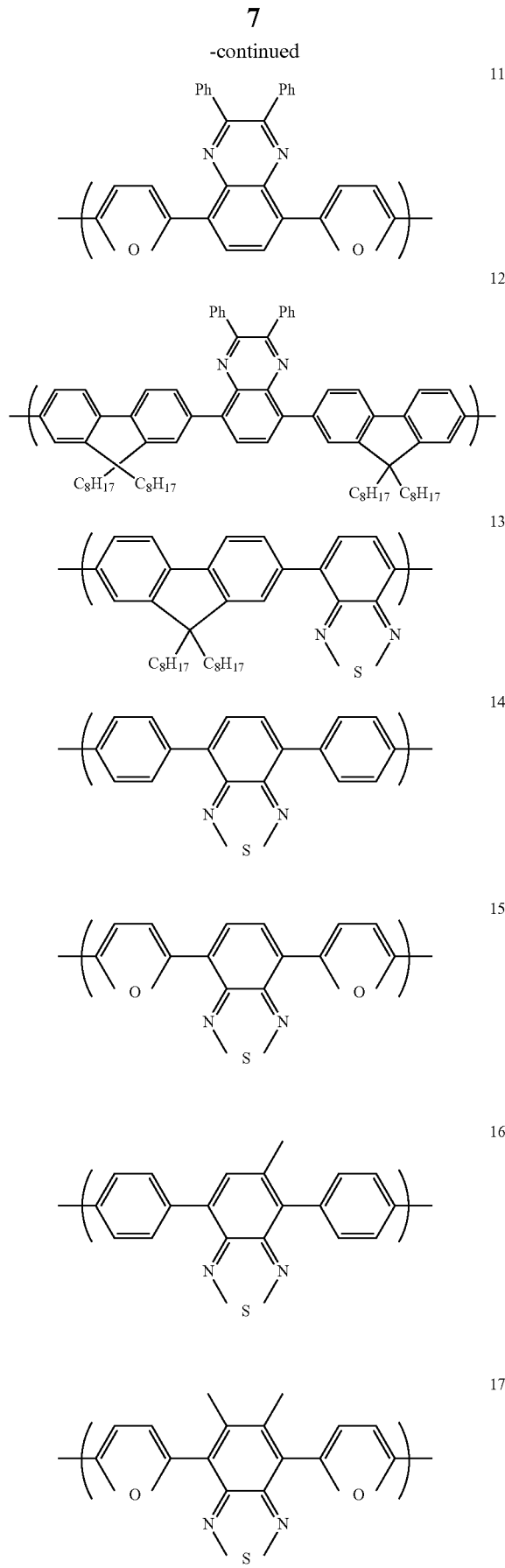

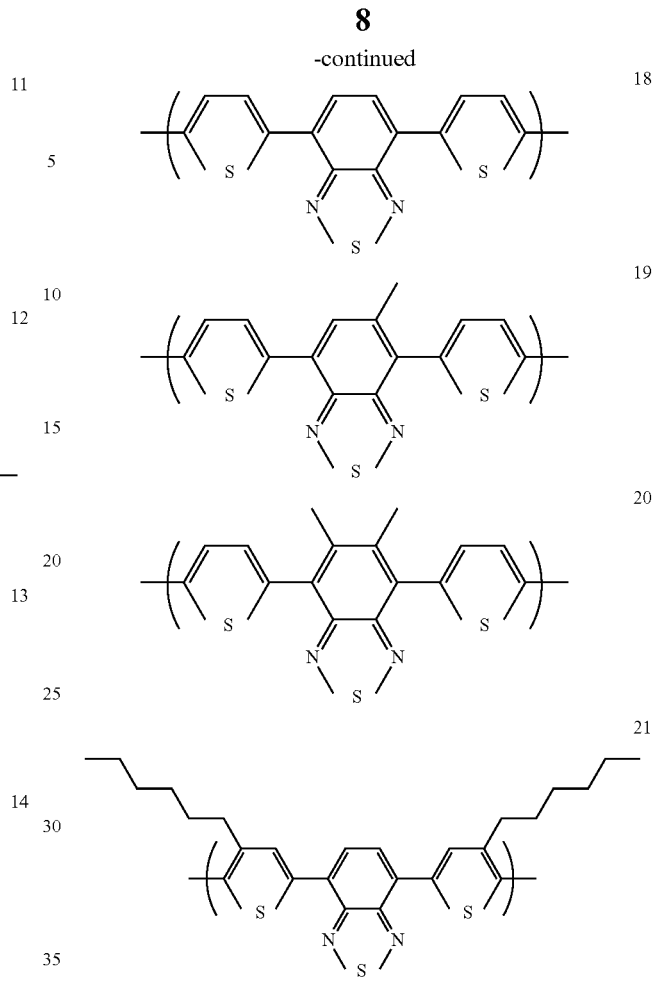

Turning to the emitting phase, the emitting phase may consist of the host material and the metal complexes. It is preferred that the or each metal complex in an emissive domain is covalently bound to the host material. Preferably, the host material is a polymer in which case the or each metal complex may be bound to a polymeric host material in the same manner as described in WO 03/091355. This ensures that each metal complex resides in a discrete emissive domain in the phase-separated layer, which is essential to avoid quenching by the charge transport phase. The metal complex may be pendent from the host polymer or may form a part of the backbone of the host polymer. This is discussed in more detail below in relation to the material according to the third aspect of the present invention.

Residence of a metal complex in a discrete emissive domain alternatively can be achieved by selecting materials appropriately so that the metal complex has poor solubility in the charge transport material and good solubility in the host material. In this embodiment, the host material effectively is acting as a solvent to the metal complex. Suitable materials for the charge transport material and the host material in this embodiment would be where one of the charge transport material and the host material is polar and the other is non-polar, which can be achieved by provision of polar and non-polar substituents. For example, a non-polar charge transport material can be used in combination with a polar host material, which would act as a solvent to a polar metal complex.

Yet a further alternative is to select suitable materials such that each metal complex resides in a discrete emitting domain by virtue of electrostatic, non-covalent interactions. Hydrogen bonding is an example of an electrostatic, non-covalent interaction.

Referring to the host material, this is preferably a polymer and may be a conjugated polymer containing partial, full or cross conjugation. However, extended conjugation tends to lower the T1 energy level, which may render the polymer unsuitable for use as a host if the T1 level falls below the T1 energy level of the metal complexes.

A preferred host polymer comprises a repeat unit comprising a group which provides a break in conjugation along the polymer backbone. A break in conjugation will be provided by a twisted arylene group such as a twisted biphenyl group. A break in conjugation serves to limit the conjugation length, thus maintaining a high T1 energy level. An example of a suitable repeat unit has general formula II:

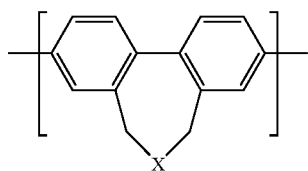

which may be further substituted and where X represents sulphur or oxygen. Twisted biphenyls of the type shown in general formula II are disclosed in WO 02/26856, for example:

A further preferred host polymer comprises a repeat unit comprising vinyl carbazole (shown below); or cyclodextrin (C42H70O35) or a derivative thereof where one or more of the H atoms has been replaced by a substituent group.

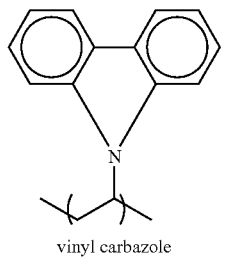

vinyl carbazole

Referring to the metal complexes, usually the metal complex group will include a carbon-metal bond. However this is not essential in the present invention. Any suitable metal complex dopant can be used.

A metal complex can be considered as a metal (M) surrounded by an appropriate number of ligands.

Heavy elements M induce strong spin-orbit coupling to allow rapid intersystem crossing and emission from triplet states (phosphorescence). Suitable heavy metals M include
  lanthanide metals such as cerium, samarium, europium, terbium, dysprosium, thulium, erbium and neodymium; and
  d-block metals, in particular those in rows 2 and 3 i.e. elements 39 to 48 and 72 to 80, in particular ruthenium, rhodium, palladium, rhenium, osmium, iridium, platinum and gold.

Preferably, each metal complex contains a lanthanide, actinide or transition metal. Most preferably, each metal complex contains a transition metal.

The nature of the ligands in a metal complex may be selected in order to optimize compatibility of the metal complex with the polymers or oligomers further.

The ligands in the metal complexes can be monodentate, bidentate or tridentate.

A preferred metal complex contains a ligand selected from the group consisting of a cyclometalating, beta-diketonates; phenylpyridine; and 2-(2-pyridyl)-benzo(b)thiophene (btp).

A preferred metal complex contains a bidentate ligand.

A preferred metal complex contains a ligand comprising at least one nitrogen atom for coordination with the metal.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission colour is determined by the choice of the metal. The sharp emission is generally narrow, resulting in a pure colour emission useful for display applications.

The d-block metals form complexes with carbon or nitrogen donors such as porphyrin or bidentate ligands of formula (IX):

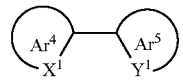

wherein Ar4 and Ar5 may be the same or different and are independently selected from optionally substituted aryl or heteroaryl; X1 and Y1 may be the same or different and are independently selected from carbon or nitrogen; and Ar4 and Ar5 may be fused together. Ligands wherein X1 is carbon and Y1 is nitrogen are particularly preferred.

Examples of bidentate ligands are illustrated below:

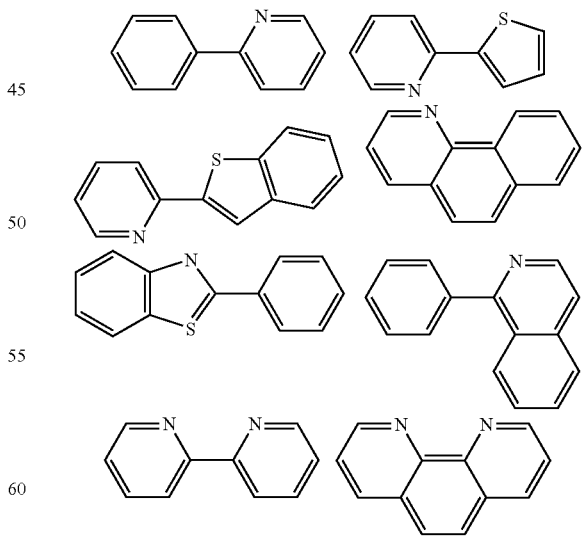

Each of Ar4 and Ar5 may carry one or more substituents. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed in WO 02/66552.

Other ligands suitable for use with d-block elements include diketonates, in particular acetylacetonate (acac); triarylphosphines and pyridine, each of which may be substituted.

As mentioned above, the present device is particularly advantageous for green dopants. Green emitting metal complexes will be known to those skilled in this art, for example Ir complexes such as Ir(ppy)3(ppy=2-phenylpyridine).

In one embodiment, it is preferred that each host material is covalently bound to the charge transport material, which preferably is a charge transport polymer. However, this is not essential and the host material may instead simply be physically mixed with the charge transport material. In either case, to form the phase-separated light-emissive layer, a solution comprising the charge transport material, host material and metal complexes is deposited and allowed to phase separate over time to form a charge transport phase and an emitting phase comprising a plurality of discrete emissive domains. Thus, a second aspect of the present invention provides a method of making a light emitting device as defined in relation to the first aspect of the present invention. The method according to the second aspect comprises the step of depositing a layer of a solution comprising the charge transport material, host material and metal complexes and allowing the layer to phase separate over time to form a charge transport phase and an emitting phase comprising a plurality of discrete emissive domains.

In some cases, it may be advantageous to anneal the light-emissive layer in order to encourage and optimize the phase separation. Annealing is preferably carried out at a temperature below the Tg of the or each polymer in the layer. Thus, the method according to the second aspect optionally includes a step of annealing the layer at a temperature below the Tg of the or each polymer in the layer.

In the method according to the second aspect, preferably the light emissive layer is deposited by solution processing. Ink-jet printing and spin-coating are preferred solution processing techniques.

Spin-coating is particularly suitable for devices wherein patterning of the electroluminescent material is unnecessary—for example for lighting applications or simple monochrome segmented displays.

Inkjet printing is particularly suitable for high information content displays, in particular full colour displays. Inkjet printing of OLEDs is described in, for example, EP 0880303.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

It will be apparent from the above that novel phosphorescent materials are used in at least some embodiments of the device according to the first aspect of the present invention As such, a third aspect of the invention provides novel phosphorescent materials, in particular a phosphorescent material comprising:
a polymer; and
metal complexes for emitting light; and
characterized in that the polymer comprises host regions and charge transport regions, each metal complex being covalently attached to a host region, each charge transport region having a T1 energy level lower than the T1 energy level of the metal complexes and each host region having a T1 energy level higher than the T1 energy level of the metal complexes.

The charge transport regions in the polymer correspond to the charge transport phase after phase separation. Together, the host regions in the polymer and the metal complexes correspond to the emissive domains after phase separation.

In order for each region in the polymer to have a distinct T1 level, typically, there will be a break in conjugation between successive host regions and charge transport regions.

The phosphorescent material according to the third aspect relates to the embodiment discussed above in relation to the first aspect where each host polymer is covalently bound to a charge transport polymer. It will be understood that in the material according to the third aspect, typically, each host region will comprise a host polymer and each charge transport region will comprise a charge transport polymer.

The phosphorescent material according to the third aspect can be considered to be a block copolymer of charge transport blocks (the charge transport regions) and host blocks (the host regions). The charge transport regions present typically will have a distribution of lengths and thus molecular weights. Further, the host regions present typically will have a distribution of lengths and thus molecular weights. Phase separation, and the shape and size of the discrete host domains would likely be dependent on the relative lengths and molecular weights of the regions, the flexibility and relative polarity of the regions, the chemical structure of the regions, and the solvent. Micelle morphology is preferred. In order to achieve the desired phase separation when the phosphorescent material is deposited as a layer from solution, the molecular weight of each region should be relatively high, for example in the range of from 30,000-50,000.

As discussed above in relation to the first aspect each metal complex may be pendent from a host region or may form a part of the backbone of the polymer in a host region.

It is preferred that the metal complex is conjugatively linked to the host polymer.

When selecting a metal complex to be pendent from the backbone of the polymer in a host region, the host region may have a structure as shown in general formula III below:

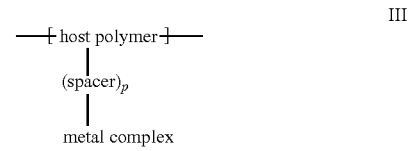

III where p is greater than or equal to 0.

With a view to further controlling the properties of the material, the spacer group may be used to interrupt conjugation in the material. Accordingly, in one embodiment there is provided a non-conjugated spacer group.

The length of the spacer group, and in particular its length, can be used to control to some extent the separation of the metal complex from the polymer backbone. Optimising the distance between the host polymer and the metal complex can improve charge trapping.

Preferred spacer groups include C1-C10 alkylene groups, in particular (CH2)n where n=1 to 10, and C1-C10 alkylene oxy groups.

A section of a material where the metal complexes are pendent from the host polymer is shown below:

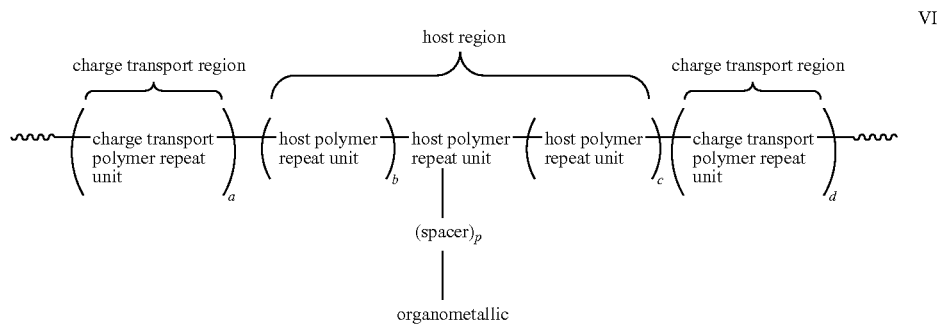

VI where a, b, c and d are all selected so as to obtain phase separation when the polymer is deposited as a layer from solution.

Where a metal complex is not pendent from the polymer backbone, the host region may have a structure as shown in general formula IV or general formula V below:

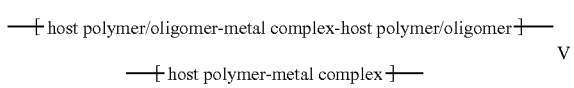

IV

V

Usually, in general formulas IV and V, the metal complex will be joined to the backbone of the polymer or oligomer through only one of its ligands. However, there may be a preferred embodiment where the metal complex is joined to the backbone of the polymer or oligomer through two of its ligands.

The metal complex repeat unit in the material shown in general formulas IV and V may have the structure XIV:

XIV where L and L1 are ligands. Suitable ligands are discussed above. Preferably L is a bidentate ligand. The L and L1 ligands may be the same or different from one another. In one embodiment it is preferred that L is not the same as the L1 ligand (or at least one of the L1 ligands, where more than one L1 ligand is present).

Ligands L1 (which may the same or different from one another) are incorporated to satisfy the valency of the metal. In this regard, L1 can be a bidentate or monodentate ligand. "q" is a number that is chosen accordingly so that the valency of the metal is satisfied.

In one aspect, preferred L1 groups include cyclometalating, beta-diketonates. In another aspect, L and L1 may be selected such that L has a higher T1 level than L1. Energy is thereby transferred from L to L1 in order to obtain emission from L1. For example, L may be phenylpyridine and L1 may be 2-(2-pyridyl)-benzo(b)thiophene (btp).

The afore-mentioned ligands also are suitable for use in other embodiments of the invention where the metal complex does not form a part of the host polymer backbone.

A section of a material where the metal complexes are not pendent from the host polymer backbone is shown below in formula VII:

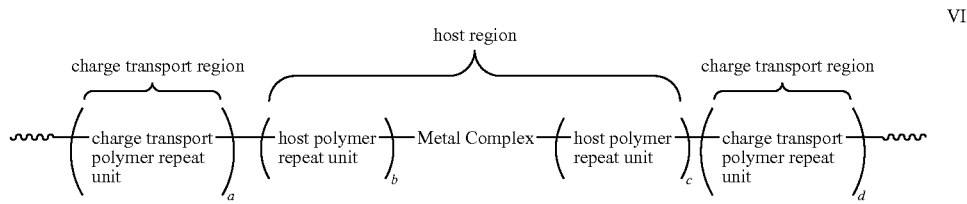

VII where a, b, c and d are all selected so as to obtain phase separation when the polymer is deposited as a layer from solution. An example where the metal complex forms part of the backbone is shown below in general formula VIII:

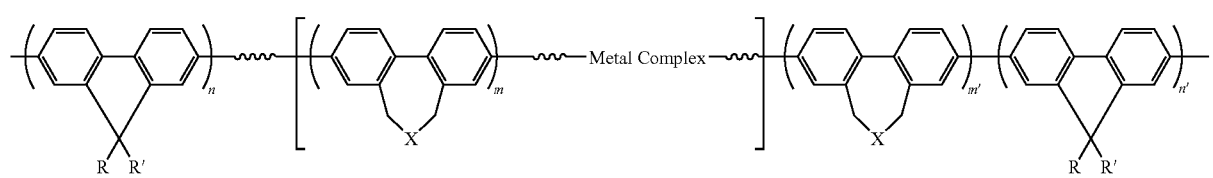

VIII where X represents sulphur or oxygen; R and R' may be the same or different and R and R' each represents H or a substituent group; m, m', n and n' are selected so as to obtain phase separation when the polymer is deposited as a layer from solution. Preferred R and R' groups are as defined above in relation to general formula I.

The materials according to the third aspect are extremely useful in OLEDs, particularly, for large-area devices like matrix displays. Also, the present materials are of use in electrically pumped organic lasers.

A fourth aspect of the invention provides a method of making a phosphorescent material as defined in the third aspect, said method comprising the steps of:

(i) polymerizing one or more first monomers comprising general formula X or XI with host monomers that are different to the first monomer to form a host polymer containing one or more metal complexes and having at least two reactive end groups;

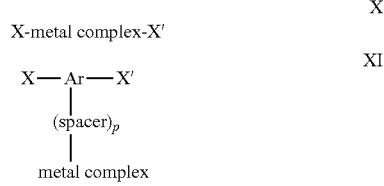

where X and X' each represents reactive end group; p is greater than or equal to 0 and Ar represents an aryl or heteroaryl group, preferably Ar represents a twisted aryl or heteroaryl group; and (ii) coupling the host polymer from step (i) with a charge transport monomer, charge transport oligomer, or charge transport polymer at each of the positions occupied by a reactive end group on the host polymer.

The phosphorescent materials according to the third aspect can be prepared by using the well-known Suzuki coupling reaction, preferably using a 'seeded' two-step approach. A Suzuki coupling reaction is described in U.S. Pat. No. 5,777,070 and a derivative thereof is described in WO 00/53656.

Preferably, polymerizing in step (i) and coupling in step (ii) is carried out using Suzuki coupling.

In overview, the Suzuki coupling reaction involves polymerizing monomers in the presence of a palladium catalyst and a base. The reaction involves a reactive group on one monomer and a reactive group on another monomer. Organic bases are preferred.

One of the reactive groups involved in the Suzuki coupling reaction will be a boron derivative group selected from boronic acid, boronic acid ester (preferably C1-C6)), and borane (preferably C1-C6). Boronic acid is preferred.

The other reactive group involved in the Suzuki coupling reaction typically will be a halide or sulfonate. A preferred halide group is bromide. Examples of suitable sulfonate reactive groups include triflate, mesylate, phenyl sulfonate, and tosylate.

Each monomer will have at least two reactive groups. Suzuki polymerisation may be used to prepare regioregular, block and random copolymers. In particular, homopolymers or random copolymers may be prepared when each monomer has one reactive halide or sulfonate group and one reactive boron derivative group. Alternatively, block or regioregular, in particular AB, copolymers may be prepared when both reactive groups of a first monomer are boron derivative groups and both reactive groups of a second monomer are halide or sulphonate.

The nature of the reactive end groups on the charge transport polymers and the host polymers can be selected so that the polymers are combined together in the phosphorescent material to form charge transport regions and host regions in the desired order. Preferably, the phosphorescent material comprises alternating charge transport regions and host regions.

BRIEF DESCRIPTION OF THE DRAWINGS

The present invention now will be described in more detail with reference to the attached Figures, in which.

DETAILED DESCRIPTION

Figure 1:
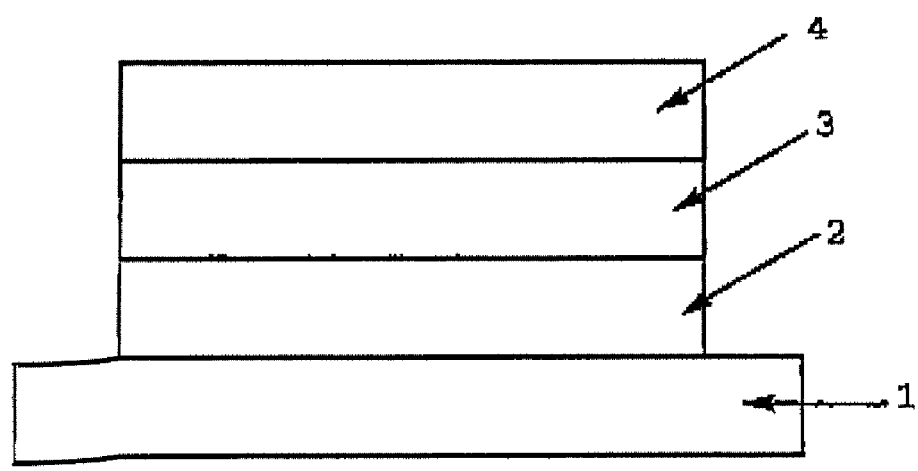
FIG. 1 shows the structure of one OLED according to the invention.

With reference to FIG. 1, the architecture of one LED according to the first aspect of the invention comprises a transparent glass or plastic substrate 1, an anode 2 of indium tin oxide and a cathode 4. A light-emissive layer 3 is provided between anode 2 and cathode 4.

Further layers may be located between anode 2 and cathode 3, such as charge transporting, charge injecting or charge blocking layers.

In particular, it is desirable to provide a conductive hole injection layer formed of a doped organic material located between the anode 2 and the light-emissive layer 3 to assist hole injection from the anode. Examples of doped organic hole injection materials include poly(ethylene dioxythiophene) (PEDT), in particular PEDT doped with polystyrene sulfonate (PSS) as disclosed in EP 0901176 and EP 0947123, or polyaniline as disclosed in U.S. Pat. No. 5,723,873 and U.S. Pat. No. 5,798,170.

If present, a hole transporting layer located between anode 2 and light-emissive layer 3 preferably has a HOMO level of less than or equal to 5.5 eV, more preferably around 4.8-5.5 eV.

If present, an electron transporting layer located between light-emissive layer 3 and cathode 4 preferably has a LUMO level of around 3-3.5 eV.

Cathode 4 is selected from materials that have a workfunction allowing injection of electrons into the electroluminescent layer. Other factors influence the selection of the cathode such as the possibility of adverse interactions between the cathode and the electroluminescent material. The cathode may consist of a single material such as a layer of aluminium. Alternatively, it may comprise a plurality of metals, for example a bilayer of calcium and aluminium as disclosed in WO 98/10621, elemental barium disclosed in WO 98/57381, Appl. Phys. Lett. 2002, 81(4), 634 and WO 02/84759 or a thin layer of dielectric material to assist electron injection, for example lithium fluoride disclosed in WO 00/48258 or barium fluoride, disclosed in Appl. Phys. Lett. 2001, 79(5), 2001. In order to provide efficient injection of electrons into the device, the cathode preferably has a workfunction of less than 3.5 eV, more preferably less than 3.2 eV, most preferably less than 3 eV.

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

In a practical device, at least one of the electrodes is semi-transparent in order that light may be emitted. Where the anode is transparent, it typically comprises indium tin oxide. Examples of transparent cathodes are disclosed in, for example, GB 2348316.

The embodiment of FIG. 1 illustrates a device wherein the device is formed by firstly forming an anode on a substrate followed by deposition of an electroluminescent layer and a cathode, however it will be appreciated that the device of the invention could also be formed by firstly forming a cathode on a substrate followed by deposition of an electroluminescent layer and an anode.

Figure 2:
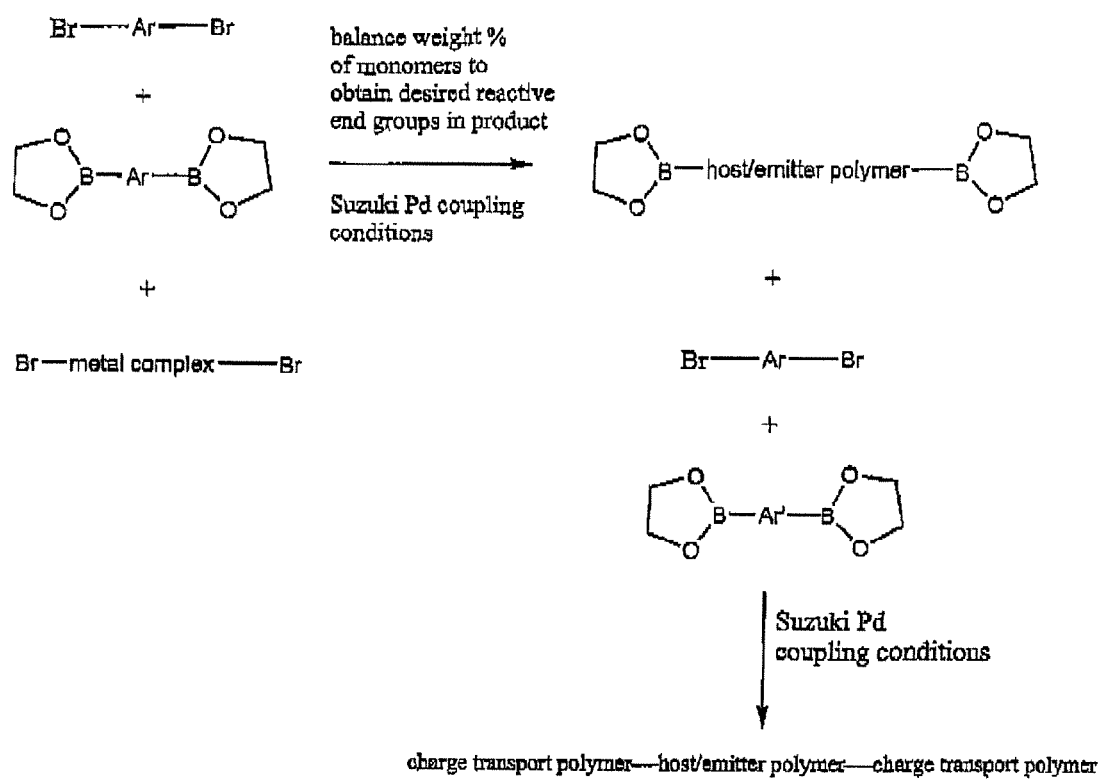
FIG. 2 shows schematically one suitable method for making a phosphorescent material according to the third aspect of the invention.

Referring to FIG. 2, in the first step host polymers having a distribution of lengths are made, for example according to the method described in WO 03/091355. Each host polymer contains one or more metal complexes. No end capping reagent is used when the host polymers are made so as to retain a reactive group at each end of each host polymer.

In the second step, charge transport monomers are added to the products from the first step and the mixture undergoes Suzuki coupling to form the phosphorescent material.

As a third step, if no end capping reagent is used in the second step, the first step can be repeated and the products thereof can undergo Suzuki coupling with the products of the second step. As a fourth step, charge transport monomers can be added to the products from the third step and the mixture can undergo Suzuki coupling. An end capping reagent can be used in the third or the fourth step to end cap the polymer.

Figure 3:
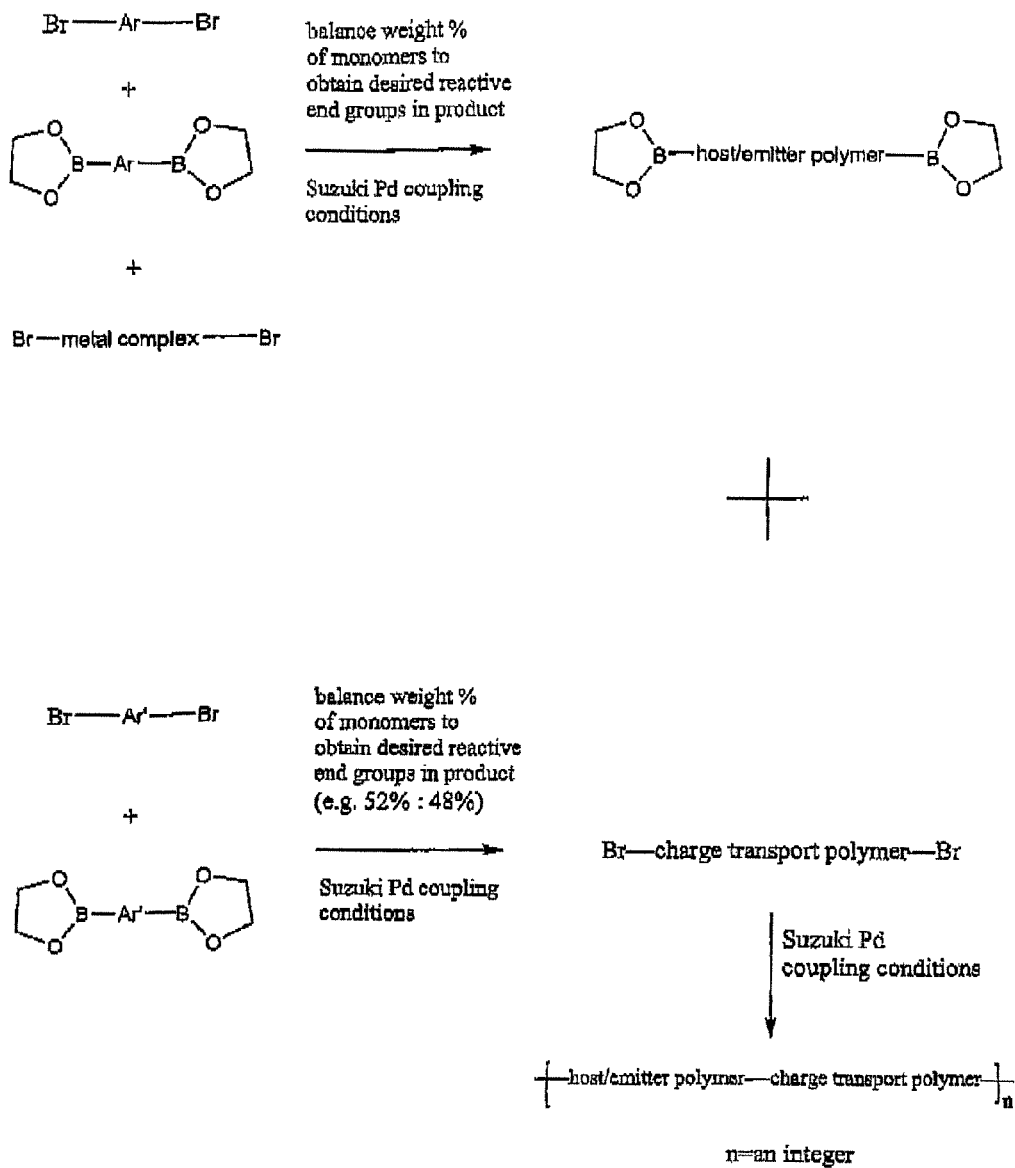
FIG. 3 shows schematically another suitable method for making a phosphorescent material according to the third aspect of the invention.

Referring to FIG. 3, in the first step, the charge transport regions are made by polymerizing monomers by Suzuki coupling to form charge transport polymers having a distribution of lengths and having a reactive end group at each end of each polymer. Further, host polymers, each containing one or more metal complexes, having a distribution of lengths are made, for example according to the method described in WO 03/091355. No end capping reagent is used when the host polymers are made so as to retain a reactive group at each end of each host polymer.

In the second step the products from the first step undergo Suzuki coupling to form the phosphorescent material.

In FIGS. 2 and 3, the monomer having formula X can be replaced with a monomer having formula XI.

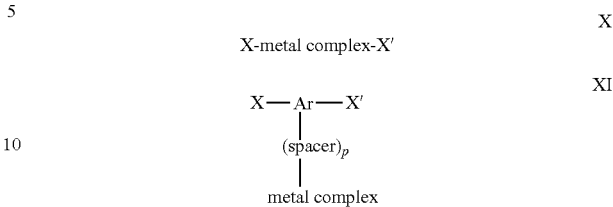

where X and X' each represents reactive end group; p is greater than or equal to 0 and Ar represents an aryl or heteroaryl group. Preferably Ar represents a twisted aryl or heteroaryl group.

In FIGS. 2 and 3, Ar and Ar' each represent a group comprising an aryl or heteroaryl group.

EXAMPLES

Example 1

Preparation of Host and Emitter Block

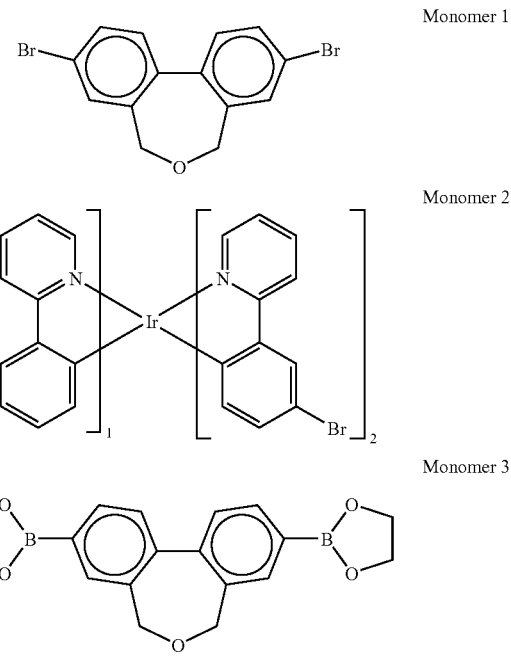

3,9-dibromo-5,7-dihydro-dibenz[c,e]oxepin (monomer 1) was prepared in accordance with the method of Example 1 in WO 02/26856.

Monomer 2 was prepared according to the method of WO 02/068435.

Monomers 1, 2 and 3 were polymerised by Suzuki coupling in a ratio of 43 wt %:5 wt %:52 wt %, respectively to form "host and emitter blocks" with boronic acid end groups.

Example 2

Preparation of Charge Transport Block

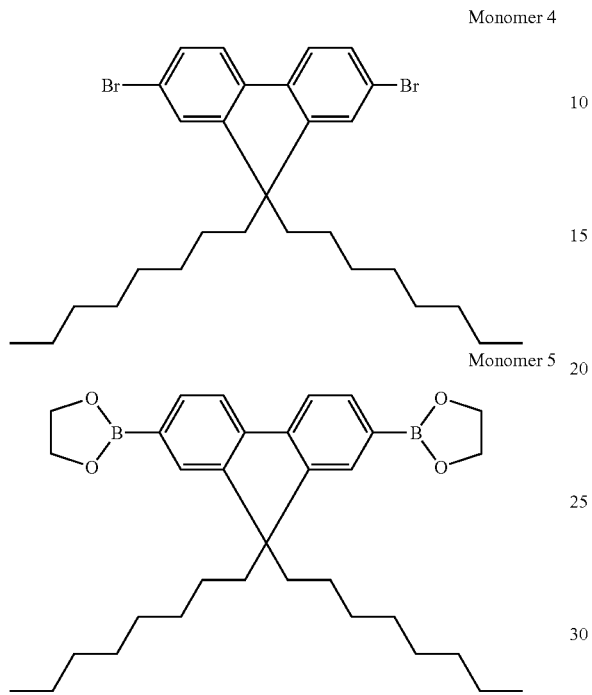

Monomer 4 and monomer 5 where polymerised by Suzuki coupling in a ratio of 52%:48%, respectively to form charge transport "blocks" with bromide end groups.

Example 3

Preparation of Phosphorescent Polymer

The products of Examples 1 and 2 were combined and reacted by Suzuki coupling. The products were end capped using an end capping reagent.

Example 4

Preparation of a Phosphorescent Polymer

The product of Example 1 was combined with monomers 4 and 5. Suzuki coupling was carried out to form a B-A-B block copolymers, where A represents a "host and emitter block" and each B represents a charge transport block. The lengths of the host and emitter blocks were determined by Example 1.

The products of Example 4 were end capped using an end capping reagent.

If desired, reactive end groups could be retained at both ends of the B-A-B block copolymers. In this case, Example 1 could be repeated and the products thereof combined with the products of Example 4. Suzuki coupling then could be carried out to form A-B-A-B-A block copolymers. By retaining reactive end groups the A-B-A-B-A block copolymers could be combined with monomers 4 and 5, and Suzuki coupling carried out to form B-A-B-A-B-A-B block copolymers. By similar repetition, further A and B blocks could be added.

The invention claimed is:

1. An organic light emitting device having a phase-separated light-emissive layer comprising:
   a charge transport phase comprising a charge transport material; and
   an emitting phase, the emitting phase comprising a plurality of discrete emissive domains dispersed in the charge transport phase, each emissive domain comprising a host material and one or more metal complexes for emitting light by phosphorescence;
   wherein the charge transport material has a T1 energy level lower than the T1 energy level of the one or more metal complexes and the host material has a T1 energy level higher than a T1 energy level of the one or more metal complexes.

2. A device according to claim 1, wherein the metal complexes are metal complexes for emitting green light having a wavelength in the range of from 510 nm to 580 nm.

3. A device according to claim 1, wherein the charge transport material is a charge transport polymer.

4. A device according to claim 3, wherein the charge transport polymer is conjugated.

5. A device according to claim 4, wherein the charge transport polymer comprises one or more aryl or heteroaryl repeat units.

6. A device according to claim 5, wherein the one or more aryl or heteroaryl repeat units comprise a substituted or unsubstituted fluorene group.

7. A device according to claim 1, wherein each metal complex is covalently bound to the host material in an emissive domain.

8. A device according to claim 1, wherein the host material comprises a repeat unit comprising a twisted biphenyl group.

9. A device according to claim 1, wherein each metal complex contains a transition metal.

10. A device according to claim 9, wherein the transition metal is Ir.

11. A device according to claim 1, wherein each host material is covalently bound to the charge transport material.

12. A method of making a device as defined in claim 1, comprising the step of:
   depositing a layer of a solution comprising the charge transport material, host material, and metal complexes and allowing the layer to phase separate over time to form a charge transport phase and an emitting phase comprising a plurality of discrete emissive domains.

13. A method according to claim 12, wherein one or both of the charge transport material and the host material comprise polymers, the method further including the step of annealing the layer at a temperature below the Tg of the or each polymer in the layer.

* * * * *